US005741368A

United States Patent [19]
Sahbari

[11] Patent Number: 5,741,368
[45] Date of Patent: Apr. 21, 1998

[54] DIBASIC ESTER STRIPPING COMPOSITION

[75] Inventor: Javad J. Sahbari, San Jose, Calif.

[73] Assignee: Silicon Valley Chemlabs, Santa Clara, Calif.

[21] Appl. No.: 593,628

[22] Filed: Jan. 30, 1996

[51] Int. Cl.$^6$ ........................................... B08B 7/04
[52] U.S. Cl. ........................... 134/38; 134/42; 134/10
[58] Field of Search ................... 134/2, 38, 40, 134/42, 10, 26, 29

[56] References Cited

U.S. PATENT DOCUMENTS

| | | | |
|---|---|---|---|
| 3,673,099 | 6/1972 | Corby et al. | |
| 4,438,192 | 3/1984 | Archer et al. | 430/329 |
| 4,617,251 | 10/1986 | Sizensky | 430/256 |
| 4,744,834 | 5/1988 | Haq | 134/38 |
| 4,760,014 | 7/1988 | Wong | 430/399 |
| 4,791,043 | 12/1988 | Thomas et al. | 430/256 |
| 4,824,763 | 4/1989 | Lee | 430/258 |
| 4,927,556 | 5/1990 | Pokorny | 510/206 |
| 5,062,988 | 11/1991 | Dishart et al. | 510/175 |
| 5,084,200 | 1/1992 | Dishart et al. | 510/175 |
| 5,106,525 | 4/1992 | Sullivan | 510/206 |
| 5,188,675 | 2/1993 | Dormon-Drailsford | 134/4 |
| 5,196,136 | 3/1993 | Dishart et al. | 510/413 |
| 5,279,771 | 1/1994 | Lee | 252/548 |
| 5,308,745 | 5/1994 | Schwartzkopf | 430/329 |
| 5,531,889 | 7/1996 | Baron et al. | 210/167 |

FOREIGN PATENT DOCUMENTS

| | | |
|---|---|---|
| 0 163 202 | 5/1985 | European Pat. Off. |
| 267-540-A | 10/1986 | European Pat. Off. |

Primary Examiner—Jill Warden
Assistant Examiner—Alexander Markoff
Attorney, Agent, or Firm—David H. Jaffer

[57] ABSTRACT

A mixture of a dibasic ester (DBE), an alcohol, and water to remove photoresist from a silicon wafer substrate. Photoresist is effectively removed at ambient temperature with this non-phenolic, non-halogenated stripper solution. Dissolved photoresist is easily separated from the water mixture for disposal.

13 Claims, No Drawings

DIBASIC ESTER STRIPPING COMPOSITION

BACKGROUND OF THE INVENTION

1. Field of the Invention

This invention is directed to a composition and method for removal of photoresist materials from a substrate, such as a silicon wafer. Mixtures of a dibasic ester, an alcohol, and water are used to strip hard to remove photoresist materials, such as photoresist which has been subjected to baking process, without damaging the substrate. The method is even effective at ambient temperatures (20°–40° C.).

2. Brief Description of the Prior Art

Photoresist materials are commonly used as coating masks in the fabrication of integrated circuits. During the fabrication process, photoresist materials are applied to a substrate using various techniques known in the art. The substrate, now coated with photoresist materials, is then exposed with radiation, usually in the UV, e-beam or x-ray wavelengths. After exposure the coated substrate is developed leaving a defined pattern of photoresist materials on the substrate. The photoresist materials that remain on the substrate after developing are used to mask the substrate for further processing. After further processing, the photoresist materials are stripped from the substrate using a photoresist stripper.

Further processing of the photoresist materials after developing, such as high temperature post exposure bake, ion implantation and deep UV radiation hardening lead to highly crosslinked photoresist materials which are extremely resistant to dissolution in most conventionally employed organic strippers. Halogenated and phenolic hydrocarbon solvents have been used to remove these extremely resistant photoresist materials. Use of these types of solvents is undesirable due to the hazards they pose to technicians carrying out the stripping process and due to the potential pollution and environmental problems associated with disposal of the waste product. Alkaline strippers have also been utilized to remove these resistant photoresist materials. Use of these types of strippers is undesirable due to the corrosion they cause to substrates containing metal films, particularly aluminum or various combinations or alloys of active metals such as copper or tungsten.

SUMMARY OF THE INVENTION

It is a primary object of the present invention to provide an effective stripping composition for positive photoresist which is water based, non-halogenated, non-phenolic and non-alkaline.

Another object of the present invention is to provide a composition and method for removal of photoresist which is highly effective for removing photoresist from a substrate at ambient temperatures.

A further object of the present invention is to provide a photoresist removal composition which causes minimal corrosion to substrates and metal films.

Briefly, the preferred embodiments of the present invention utilizes a mixture of a dibasic ester (DBE), an alcohol, and water to remove photoresist from a substrate. The process is effective at ambient temperature.

DETAILED DESCRIPTION OF THE PREFERRED EMBODIMENT

This invention provides a process for stripping photoresist from a substrate, even if the photoresist has been baked and exposed to short wavelength hardening radiation. The composition and method are effective at ambient temperature (20° C. to 40° C.), and a synergistic effect enhancing the effectiveness of the stripper is noted when a mixture comprising water, a dibasic ester, and an alcohol is used. The stripping composition is comprised of:

(a) from 5% to 95% by weight of a dibasic ester (or mixture of such ethers) having the general formula:

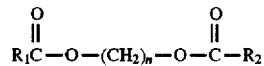

in which n is an integer from 1 to 5, and $R_1$ and $R_2$ are alkyl groups of 1 to 4 carbons;

(b) from 1% to 65% by weight of tetrahydrofurfuryl alcohol or of a water soluble alcohol, glycol, or glycol ether compound having the general formula $R-(CHOH)_n-R'$ where $R$ and $R'$ denote hydrogen atoms, or alkyl groups of 1 to 7 carbons, or alkoxyl groups of 1 to 4 carbons, and n=1–3 (higher boiling alcohols, glycols, etc. are preferred if processing will occur at elevated temperatures); and (c) from 5% to 60% by weight deionized water.

Other ingredients such as wetting agents, surfactants, dyes or colorants may be added to the stripping composition for specific applications.

It is more preferred that the photoresist stripper composition contain from 15%–85% by weight of the dibasic ester, from 10%–80% by weight of the alcohol/glycol/glycol ether and from 5%–60% by weight deionized water. It is yet more preferred that the photoresist stripper composition contain from 25%–75% by weight of the dibasic ester, from 20%–70% by weight of the alcohol/glycol/glycol ether and from 25%–55% by weight deionized water. In its most preferred embodiment, the photoresist stripper composition comprises from 25%–50% by weight of the dibasic ester, from 30%–50% by weight of the alcohol/glycol/glycol ether and from 25%–55% by weight deionized water.

As discussed below, the performance of the stripper of the present invention is enhanced when the combination of dibasic ester, alcohol/glycol/glycol ether, and water is used. The chemical nature of this synergistic effect is not known. However, dibasic ethers are generally not soluble in water, and the alcohol/glycol/glycol ether component allows creation of a single phase mixture. Thus, the percentages of the components may be adjusted, but should be within ranges where a single phase mixture is obtained. The percentages of the components (and the particular dibasic esters and alcohol/glycol/glycol ether components), strip time, and strip temperature can be adjusted to address particular photoresist stripping requirements.

The stripping compositions of the present invention are more effective even at ambient temperatures than prior art strippers, significantly less toxic (non-phenolic, non-halogenated, and easily biodegradable), and significantly less corrosive to sensitive metals than other known organic stripping solutions (because the present compositions are non-alkaline and non-acidic in aqueous solution, having a nearly neutral pH value). In addition, the compositions have no flash point because of their water content, and are therefore safer than any other commercially available organic photoresist strippers.

It is also found that the stripper waste solution can be recycled for disposal of the organic waste by dilution of the mixture with addition of more deionized water. When more water is added to the waste solution (typically on the order of 30% more water by weight), the solution separates into an aqueous phase and an organic phase, with stripped photoresist segregated into the organic phase. A separatory funnel may be used to segregate the aqueous and organic phases. Thus, the organic portion with the stripped photoresist is easily separated. It may then be incinerated or otherwise disposed of with little difficulty.

Examples of suitable dibasic esters are dimethyl adipate,

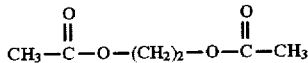

dimethyl glutarate,

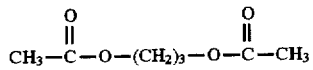

and dimethyl succinate:

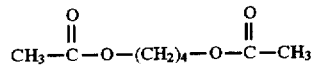

Mixtures of such esters may also be utilized. Suitable alcohols are ethanol, methanol, 2-propanol, n-propanol, n-butanol, n-pentanol, n-hexanol, n-heptanol, tetrahydrofurfuryl alcohol, ethylene glycol, propylene glycol, and glycol derivatives such as ethylene glycol and propylene glycol ethers.

The following test data demonstrate the synergistic effect of a composition including a dibasic ester, an alcohol, and water. In general, dibasic esters are insoluble or only slightly soluble in water. The use of an alcohol allows creation of a solution in which a dibasic ester and water may be mixed to create a homogenous solution.

Table 1 illustrates the stripping effect when a wafer coated with photoresist is stripped using a dibasic ester by itself. Wafers were prepared by conventional methods using three different positive photoresists: Shipley 1400 series (Shipley Company, Inc.), KTI-820 (OCG Chemicals), and AZ-1500 series (American Hoechst). Wafers were coated with photoresist, prebaked at 60° C., exposed to UV radiation, post-baked at 120° C., and then stripped at ambient temperature (26° C.) using the test solvents in Table 1. The stripping test was conducted by immersing the wafer in the solvent bath for 5 minutes with frequent agitation. The wafer was then removed, rinsed with deionized water, spin-dried, and tested for photoresist residue.

TABLE 1

| Solvent | Shipley-601 | KTI-820 | AZ-4110 |
|---|---|---|---|
| | (Percent of Photoresist Removed) | | |
| Dimethyl Succinate | 45% | 40% | 25% |
| Dimethyl Glutarate | 30-35% | 15-20% | 15-20% |
| Dimethyl Adipate | 35-40% | 15-20% | 10-15% |
| DMES Mixed* | 60-65% | 55-60% | 25-40% |

*DMES Mixed denotes dimethyl aliphatic esters (dibasic esters manufactured by Dupont). DMES Mixed is comprised of the following esters (by weight percentage): dimethyl succinate 17%, dimethyl adipate 17%, dimethyl glutarate 66%.

Table 1 shows that DBEs by themselves are unsatisfactory stripping agents.

Table 2 illustrates results achieved with a 1:1:1 by volume ratio mixture of dimethyl adipate, dimethyl glutarate, and dimethyl succinate mixed with an alcohol at 50% by weight. Wafers were baked at 150° C. and stripping time was 5 minutes at 25° C. Wafer cleanliness was rated from 1 to 10, where 1 indicates 90% residue, 5 indicates 50% residue, and 10 indicates 0% residue (100% clean).

TABLE 2

| ALCOHOL USED | SHIPLEY-601 | KTI-820 | AZ-4110 |
|---|---|---|---|
| Ethanol | 7 | 8 | 6 |
| Isopropanol | 6 | 7 | 5 |
| n-Propanol | 7 | 8 | 6 |
| n-Butanol | 5 | 6 | 4 |
| Tetrahydrofurfuryl alcohol | 4 | 5 | 4 |

Table 2 indicates a slightly enhanced performance over the results of Table 1, but still unacceptable performance as a photoresist stripper.

Table 3 illustrates stripping results achieved with a mixture of (a) from 30% to 40% by weight of a dibasic ester mixture (1:1:1 ratio by weight of dimethyl adipate, dimethyl glutarate, and dimethyl succinate (this mixture is identified as DBE1:1:1 in Tables 3 and 5); (b) 20% to 30% alcohol by weight; and (c) 35% to 50% deionized water by weight. The wafers used were baked at 120° C. and a stripping time of 5 minutes at 25° C. was used. Wafer cleanliness was rated from 1 to 10.

TABLE 3

| COMPOSITION | SHIPLEY-601 | KTI-820 | AZ-4110 |
|---|---|---|---|
| 1. 30% DBE1:1:1<br>20% Ethanol<br>50% Water | 8 | 10 | 8 |
| 2. 30% DBE1:1:1<br>30% Isopropanol<br>40% Water | 8 | 10 | 9 |
| 3. 30% DBE1:1:1<br>30% n-butanol<br>40% Water | 10 | 10 | 10 |
| 4. 35% DBE1:1:1<br>30% Tetrahydrofurfuryl alcohol<br>35% Water | 10 | 10 | 10 |

Table 3 indicates that even at ambient temperature, exceptional photoresist removal is achieved.

Table 4 illustrates the reduced corrosive effect of the stripper of the present invention on a sensitive metal substrate compared to conventional positive photoresist strippers. Three major strippers which are presently widely used in the semiconductor industry (PRS-3000 (J. T. Baker, Stripper P), EKC 830 Posistrip (Stripper E), and ACT-100 (Stripper A)) were selected and compared with a formulation in accordance with the present invention (specifically, composition 4 shown in Table 3). Silicon wafers coated by 100% copper (Substrate 1), 4% copper in aluminum (Substrate 2), 100% aluminum (Substrate 3), and 100% aluminum oxide on aluminum (Substrate 4) were used as test wafers. The wafers were emersed in a strip bath containing 95 ml of stripper and 5 ml deionized water, and heated to 75° to 80° C. for 30 minutes. The etched portion of the metal substrate dissolved into the stripping solution was measured and tested using Furnace Atomic Absorption AA/GF spectrophotometry method and inductively coupled plasma emission (ICP) spectroscopy methods to determine metal dissolved in the stripper.

TABLE 4

| SUB-STRATE | STRIPPER P pH: >11.5 | STRIPPER E pH: >11.5 | STRIPPER A pH: 11-11.5 | COMP. 4 OF TABLE 3 pH: 6-6.5 |
|---|---|---|---|---|
| 1 | >30% etched | >25% etched | >25% etched | no corrosion |
| 2 | 2-5% etched | 2-5% etched | 2-5% etched | no corrosion |
| 3 | 1-2% etched | 1-2% etched | 1-2% etched | no corrosion |
| 4 | 5-10% etched | 5-10% etched | 5-10% etched | no corrosion |

The following examples show the effectiveness of compositions of the present invention in stripping positive photoresists. Wafers coated with AZ-4110 photoresist were baked in an oven at 150° C. for 30 minutes. After baking, the wafers were emersed in the stripping solution were frequent agitation for 3 to 5 minutes. The stripped wafers then were removed and rinsed for 30 to 45 seconds with deionized water and blow dried with nitrogen gas. The minimum stripping time for each composition time for each was recorded. The surface of each stripped wafer was then tested for possible resist residue using scanning electron microscopy (SEM). The stripping was conducted at 28° C.

TABLE 5

| EXAMPLE | DBE COMPOUND (% WEIGHT) | ALCOHOL (% WEIGHT) | PHOTO-RESIST RESIDUE | STRIP TIME |
|---|---|---|---|---|
| 1 | Dimethyl Succinate (30%) | Ethanol (15%) | None | <1 min. |
| 2 | Dimethyl Adipate (30%) | Isopropanol (15%) | None | 1-2 min. |
| 3 | Dimethyl Glutarate (30%) | n-Propanol (20%) | None | <1 min. |
| 4 | DBE1:1:1 (36%) | n-Butanol (20%) | None | <1 min. |
| 5 | DBES Mixed (36%) | n-Propanol (25%) | None | <1 min. |

Note:
For all mixtures, the balance was deionized water.

In practicing the method of the present invention, the substrate (usually a silicon wafer) and photoresist are contacted with the photoresist stripper solution at ambient temperature for a stripping time sufficient to remove the photoresist from the substrate. Elevated temperature (60° C. to 80° C.) may be used for particularly difficult to remove resist, and at such temperatures a higher boiling alcohol should be used. The stripping time at ambient temperature (25° C.) is generally approximately 2-3 minutes.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for removing photoresist from a substrate comprising:
   contacting said substrate with a stripping solution for a time sufficient to remove said photoresist from said substrate, wherein said stripping solution comprises
   (a) from about 5% to about 95% by weight of one or more dibasic esters having the general formula $R_1CO_2-(CH_2)_n-CO_2R_2$ where $R_1$ and $R_2$ are alkyl groups of 1-4 carbons and n=1-5;
   (b) from about 1% to about 65% by weight of tetrahydrofurfuryl alcohol or of a water soluble alcohol, glycol, glycol ether, or mixture thereof, having general formula $R-(CHOH)_n-R'$ where R and R' are selected from the group consisting of a hydrogen atom, an alkyl group of 1-7 carbon atoms, and an alkoxyl group of 1 to 4 carbon atoms, n=1-3; and
   (c) from about 5% to about 60% by weight deionized water; and thereafter
   collecting the stripping solution; and
   adding water to the collected stripping solution to increase the weight percentage of water until the stripping solution separates into an aqueous phase and an organic phase, whereby stripped photoresist is segregated in to the organic phase.

2. The method of claim 1 where the dibasic ester is present in an amount of from about 25% to about 50% by weight.

3. The method of claim 1 where the alcohol, glycol, glycol ether, or mixture thereof, is present in an amount of from about 30% to about 50% by weight.

4. The method of claim 1 where the deionized water is present in an amount of from about 25% to about 55% by weight.

5. The method of claim 1 where the dibasic ester is selected from the group consisting of dimethyl adipate, dimethyl glutarate and dimethyl succinate.

6. The method of claim 1 where the alcohol is selected from the group consisting of ethanol, methanol, 2-propanol, n-propanol, n-butanol, n-pentanol, n-hexanol, n-heptanol, and tetrahydrofurfuryl alcohol.

7. The method of claim 1 where the glycol or glycol ether is selected from the group consisting of ethylene glycol, or propylene glycol, ethylene glycol ethers, and propylene glycol ethers.

8. The method of claim 1 where
   the dibasic esters are present in an amount of from about 25% to about 50% by weight, and are selected from the group consisting of dimethyl adipate, dimethyl glutarate and dimethyl succinate;
   the alcohol, glycol, glycol ether, or mixture thereof is present in an amount of from about 30% to about 50% by weight, and are selected from the group consisting of ethanol, methanol, 2-propanol, n-propanol, n-butanol, n-pentanol, n-hexanol, n-heptanol, tetrahydrofurfuryl alcohol, ethylene glycol, propylene glycol, ethylene glycol ethers, and propylene glycol ethers; and
   the deionized water is present in an amount of from about 25% to about 55% by weight.

9. The method of claim 1 where the stripping time is from about 1 minute to about 30 minutes.

10. The method of claim 1 where the stripping time is from about 1 minute to about 5 minutes.

11. The method of claim 1, wherein a separatory funnel is used to segregate the aqueous and organic phases.

12. The method of claim 8 where the stripping time is from about 1 minute to about 30 minutes.

13. The method of claim 8 where the stripping time is from about 1 minute to about 5 minutes.

* * * * *